(12) United States Patent
Kim

(10) Patent No.: US 6,695,032 B2
(45) Date of Patent: Feb. 24, 2004

(54) METHOD AND APPARATUS FOR FORMING COVER TAPE OF TAPE FEEDER

(75) Inventor: Young-il Kim, Changwon (KR)

(73) Assignee: Samsung Techwin Co., Ltd., Kyongsangnam-do (KR)

( * ) Notice: Subject to any disclaimer, the term of this patent is extended or adjusted under 35 U.S.C. 154(b) by 155 days.

(21) Appl. No.: 09/953,902

(22) Filed: Sep. 18, 2001

(65) Prior Publication Data

US 2002/0066530 A1 Jun. 6, 2002

(30) Foreign Application Priority Data

Dec. 1, 2000 (KR) .......................... 2000-72595

(51) Int. Cl.[7] ............... B30B 15/34; B30B 3/04; B32B 35/00; B29B 13/02; B29C 35/02
(52) U.S. Cl. .............. 156/582; 156/583.1; 156/584; 425/112; 425/335
(58) Field of Search .............. 156/582, 583.1, 156/584; 425/515, 518, 519, 520, 521, 112, 193, 194, 335

(56) References Cited

U.S. PATENT DOCUMENTS

| 3,861,123 A | * | 1/1975 | Eburn et al. ............... 53/370.5 |
| 5,531,859 A | | 7/1996 | Lee et al. ................... 156/584 |
| 5,728,257 A | * | 3/1998 | Lee ........................... 156/555 |

* cited by examiner

*Primary Examiner*—Richard Crispino
*Assistant Examiner*—Sing Po Chan
(74) *Attorney, Agent, or Firm*—Finnegan, Henderson, Farabow, Garrett & Dunner, LLP

(57) ABSTRACT

A method and apparatus for facilitating discharge of a cover tape detached from a base tape in a tape feeder are disclosed. A section of the cover tape is formed to have a predetermined shape by providing a predetermined stiffness to the cover tape. The apparatus comprises a first rotary body where at least one protruding portion is formed along an outer circumferential surface and a second rotary body where at least one groove for accommodating the at least one protruding portion is formed along an outer circumferential surface. The cover tape is then formed by passing between the first rotary body and the second rotary body.

19 Claims, 9 Drawing Sheets

METHOD AND APPARATUS FOR FORMING COVER TAPE OF TAPE FEEDER

DESCRIPTION OF THE INVENTION

1. Field of the Invention

The present invention relates to a tape feeder for a chip mounter, and more particularly, to a tape feeder for a chip mounter which detaches a cover tape from a chip mounter tape while transferring the chip mounter tape at a predetermined pitch, and discharges the cover tape detached from the chip mounter tape by forming the detached cover tape.

2. Background of the Invention

Generally, it is difficult to pick up electronic components such as semiconductor chips one by one. When the electronic components are picked up, they are easily contaminated by foreign materials such as dust. Thus, as shown in FIG. 1, an electronic part 100 is accommodated in a receiving space 12 formed on a base tape 11 to be separated from each other and is distributed in the form of a tape where a cover tape 13 is attached to the base tape 11. The receiving space is sealed by the cover tape 13.

While a chip mounter tape (not shown) is transferred by a tape feeder (not shown) of a chip mounter (not shown) at a predetermined pitch, the base tape 11 and the cover tape 13 are separated step by step. The part 100 in the receiving space 12 which is exposed as the cover tape 13 is detached is picked up by a suction nozzle (not shown) of a component mounter (not shown).

The tape feeder for a chip mounter which separates the cover tape 13 while transferring the chip mount tape at a predetermined pitch is divided, depending on the manner of removing the cover tape 13, into a manner in which the cover tape 13 is wound and a manner in which the cover tape 13 is discharged outside.

Of the above tape processing manners, a tape feeder for a chip mounter adopting the manner of winding the cover tape is disclosed in U.S. Pat. No. 5,531,859.

This electronic component feeder includes a supply means for supplying a tape, a transfer means for transferring a carrier tape to an installation position from the supply means at a preset pitch, a winding means for winding a cover tape from the carrier tape by simultaneously operating with the transfer means, a shuttle rod for connecting the winding means and the transfer means, and an actuator for reciprocating the shuttle rod to drive the winding means and the transfer means. The winding means for winding the cover tape includes a take-up reel assembly and a planet gear connected to a shaft engaged with the take-up reel assembly and rotating in only one direction.

Since the above electronic component feeder needs the additional take-up reel for winding the cover tape and a means for driving in an intermittent manner, the structure thereof becomes complicated.

The cover tape 13 is discharged, as shown in FIG. 2, as a pair of wheels 21 and 22 closely contacting each other are intermittently rotated by a driving means (not shown).

In the above manner, since the cover tape 13 is transferred by a frictional force between the two wheels 21 and 22, when adhesive material used for bonding the cover tape 13 to the base tape 11 remains, the cover tape 13 is attached to the outer circumferential surface of one of the wheels 21 and 22 while being wound. Thus, the cover tape 13 is not discharged smoothly. Also, since the cover tape 13 sways to the left and right and not being transferred in a uniform direction when it is transferred, the cover tape 13 is not accurately interposed between the wheels 21 and 22 and deviates from a contact surface between the wheels 21 and 22.

Meanwhile, since the cover tape is very flexible, many problems are generated in the manner of discharging the cover tape to the outside. For example, the cover tape swaying due to flow of air in a work place may be tangled with other parts.

SUMMARY OF THE INVENTION

To solve the above-described problems, it is an object of the present invention to provide a method for forming a cover tape to facilitate discharge of the cover tape by providing stiffness to the cover tape.

It is another object of the present invention to provided an apparatus for forming the cover tape of a tape feeder.

It is yet another object of the present invention to provide a tape feeder having an apparatus for forming the cover tape.

To achieve the above objects, there is provided a method for forming the section of a cover tape of a tape feeder to have a predetermined shape by providing a predetermined stiffness to the cover tape detached from a base tape. A base tape has electronic components, where each of the components is accommodated in a receiving space to facilitate discharge of the cover tape.

It is preferred that the cover tape is formed by passing between a first rotary body where a groove is formed, and a second rotary body where a protruding portion to be inserted in the groove is formed.

To achieve the above objects, there is provided an apparatus for forming a cover tape of a tape feeder, which comprises a first rotary body where a protruding portion is formed along an outer circumferential surface thereof, and a second rotary body rotating by being engaged with the first rotary body where a groove for accommodating the protruding portion is formed along an outer circumferential surface thereof, wherein the cover tape is formed by passing between the first rotary body and the second rotary body.

It is preferred that an elastic body is provided to bias a rotation shaft of the first or second rotary body in one direction so that one of the first and second rotary bodies is pressed against the other rotary body.

It is preferred that a heat wire for heating the cover tape is included in one of the first and second rotary bodies.

It is preferred that a plurality of the protruding portions and a plurality of the grooves are formed on the first and second rotary bodies, respectively.

It is preferred that the apparatus further comprises a ratchet wheel for preventing reverse rotation, which is installed at one of the first and second rotary bodies so as to be coaxially aligned with a rotation shaft of the rotary body.

To achieve the above objects, there is provided an apparatus for forming a cover tape of a tape feeder, which comprises a sun gear rotatably installed at a frame and having a gear portion where a groove having a predetermined shape is formed, a power transfer means for transferring an external force to rotate the sun gear, a pinch gear gripping the cover tape with a gear portion of the sun gear and rotating in one direction by being engaged with the sun gear, and a protruding portion engaged with the groove of the gear portion of the sun gear so that the cover tape can be formed to have a predetermined shape.

It is preferred that the protruding portion is formed at an outer circumference surface of the pinch gear.

It is preferred that the protruding portion is fixed to the frame to correspond to the groove.

It is preferred that the protruding portion is formed by having the pinch gear stepped.

It is preferred that a heat wire is installed at the pinch gear or the sun gear to apply heat to the cover tape during the forming.

To achieve the above objects, there is provided a tape feeder comprising a frame, a transfer wheel rotatably installed at one side of the frame and transferring a tape where components are accommodated at a predetermined pitch, a sun gear rotatably installed at the other side of the frame and having a first gear portion where a groove having a predetermined shape is formed, a power transfer mechanism for transferring an external force to rotate the sun gear, a pinch gear gripping a cover tape with the first gear portion of the sun gear and being capable of rotating in only one direction by being engaged with the sun gear, and a protruding portion for forming which is engaged with the groove of the first gear portion of the sun gear so that the cover tape can be formed to have a predetermined shape.

It is preferred that the power transfer means comprises a planet gear revolving and rotating by being engaged with second gear portion formed on the sun gear, and a link having the planet gear rotatably installed at one end portion thereof, the tape feeder further comprising a roller installed at one side of the link and another roller installed at one side of the frame, and when the link is moved in a state in which a part of the cover tape is fixed by the transfer wheel, the cover tape slips between the pinch gear and the first gear portion of the sun gear to run in the reverse direction of a releasing direction.

It is to be understood that both the foregoing general description and the following detailed description are exemplary and explanatory only and are not restrictive of the invention, as claimed.

BRIEF DESCRIPTION OF THE DRAWINGS

The above objects and advantages will become more apparent by describing in detail preferred embodiments thereof with reference to the attached drawings in which.

DESCRIPTION OF THE EMBODIMENTS

Reference will now be made in detail to the exemplary embodiments, examples of which are illustrated in the accompanying drawings. Wherever possible, the same reference numbers will be used throughout the drawings to refer to the same or like parts.

Figure 3A:
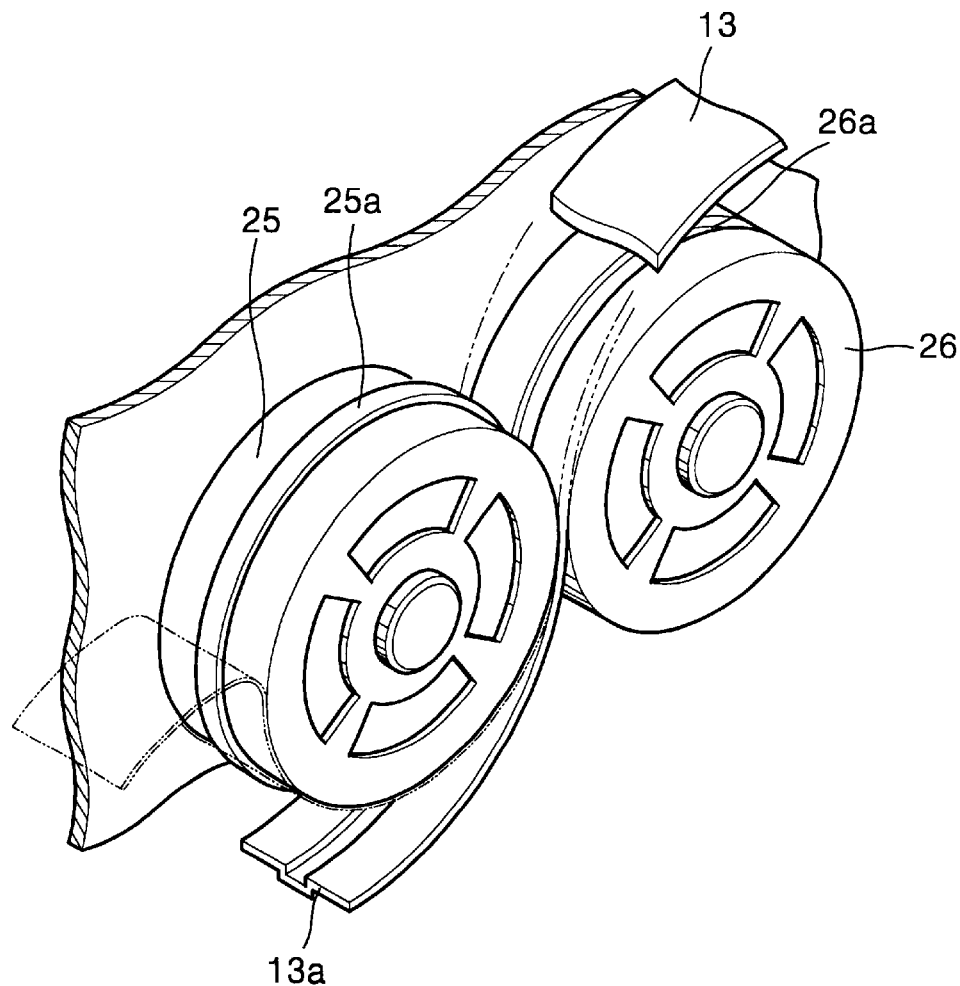
FIGS. 3A and 3B are a perspective view and a plan view of a cover tape forming apparatus according to an embodiment consistent with the present invention, respectively.
Figure 3B:
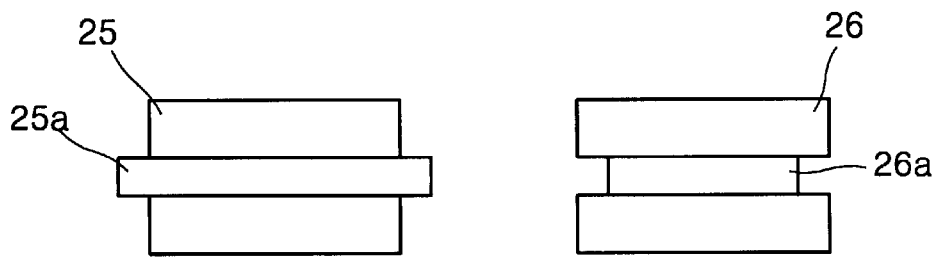

FIGS. 3A and 3B show a basic structure of a cover tape forming apparatus provided to a tape feeder according to the present invention. Referring to the drawings, the cover tape forming apparatus includes a first rotary body 25 having a protruding portion 25a formed along the circumferential surface thereof and a second rotary body 26 rotating by being engaged with the first rotary body 25 and having a groove 26a formed along the circumferential surface thereof in which the protruding portion 25a is accommodated. The cover tape 13 passes between the first and second rotary bodies 25 and 26. While the cover tape 13 passes between the rotary bodies 25 and 26, a predetermined shape in a section of the cover tape is formed by the protruding portion 25a and the groove 26a. Thus, the cover tape 13 having a plane section before passing between the first and second rotary bodies 25 and 26 forms a section having a predetermined shape as indicated by reference numeral 13a after passing between the first and second rotary bodies 25 and 26. The formation of the cover tape 13 as described above results in increased stiffness of the cover tape. Prior to the forming, the cover tape is very flexible, swaying easily even by a small external force, and is not easily discharged out of the tape feeder. In contrast, after forming, the cover tape 13 forms uniform linearity and becomes relatively stiff so as to be easily discharged to the outside. After being discharged to the outside, the cover tape 13 does not sway by external forces such as wind. In FIG. 3B, it can be seen that the first and second rotary bodies 25 and 26 are engaged with each other.

The first and second rotary bodies 25 and 26 may have various shapes. For example, the rotary bodies may have rollers or gears having teeth. Also, a mechanism for heating the cover tape may be provided to assist the forming of the cover tape. For example, the cover tape can be heated by a heat wire included in the first and second rotary bodies 25 and 26.

Preferably, a reverse rotation preventing means is provided at one of the first and second rotary bodies 25 and 26. For example, as a reverse rotation preventing means, a ratchet wheel (not shown) is installed coaxially with a rotation shaft of the first or second rotary bodies 25 and 26. Thus, the reverse rotation preventing means can prevent the formed cover tape from being discharged in the reverse direction.

Figure 4:
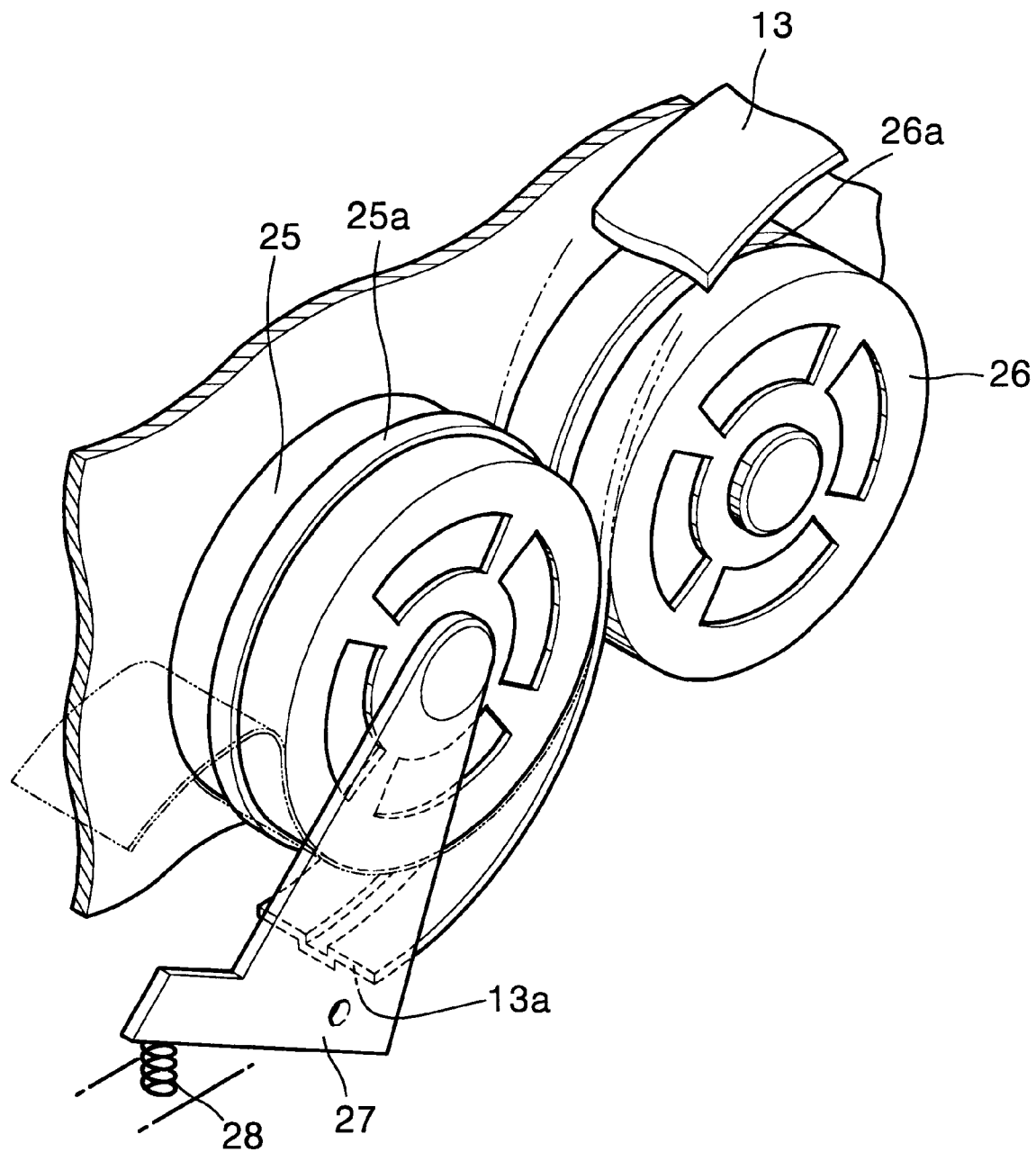
FIG. 4 is a perspective view of a cover tape forming apparatus according to another embodiment consistent with the present invention.

FIG. 4 shows a modification of the cover tape forming apparatus shown in FIG. 3. Referring to FIG. 4, a rotation shaft (not shown) of the first rotary body 25 is supported by an arm 27. The arm 27 receiving an elastic force of a spring 28 presses the first rotary body 25 against the second rotary body 26. Since the first rotary body 25 is elastically in contact with the second rotary body 26, productivity of the forming the cover tape 13 passing between the rotary bodies is improved.

Figure 5:
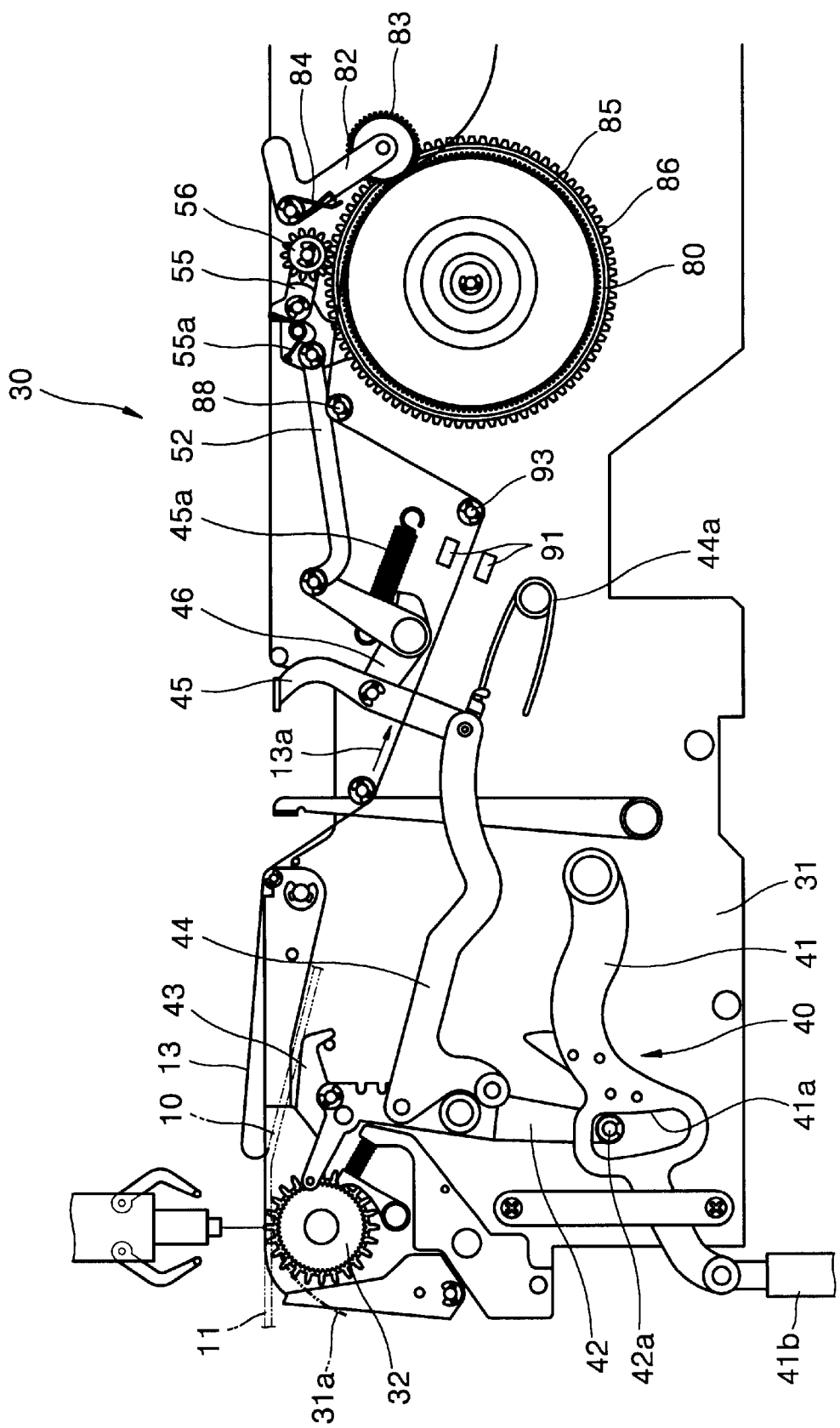
FIG. 5 is a front view of the cover tape forming apparatus of FIG. 3A.

FIG. 5 shows an example of a tape feeder for a chip mounter adopting the above-described basic forming mechanism. A tape feeder for a chip mounter detaches the cover tape sealing the receiving space and forms the cover tape while transferring the base tape of the chip mounter tape at a predetermined pitch.

As shown in the drawing, a tape feeder 30 includes a frame 31, a transfer wheel 32 installed at one side of the frame 31 and having teeth coupled to a transfer hole 14 of the base tape 11 for transferring the base tape 11 at a predetermined pitch, a sun gear 80 and a pinch gear 83 installed at the other side of the frame 31 for pulling the cover tape 13 detached from the base tape 11 while gripping the detached cover tape 13 therebetween, a driving apparatus 40 for rotating the transfer wheel 32 and the sun gear 80 at a predetermined pitch, and a forming mechanism including a groove formed at the sun gear 80 and a protruding portion formed at the pinch gear 83 for forming the cover tape 13. The forming mechanism constituting one of characteristic features of the present invention will be described in detail later.

A difference exists between the running distance of the cover tape 13 running while being gripped between the sun gear 80 and the pinch gear 83 and the length of the cover tape 13 detached from the base tape 11 by rotation of the transfer wheel 32. If the difference is allowed to be present, the cover tape 13 may break due to increased tension applied to the cover tape 13. Thus, a mechanism for compensating for the difference in length may further be provided. The compensation mechanism is operated as the cover tape 13 slides between the sun gear 80 and the pinch gear 83 whenever a sixth link 52 pivots by a roller 88 of the sixth link 52 which will be described later. This mechanism will be described in detail later.

A ratchet wheel or sprocket having teeth formed at the outer circumferential surface thereof is used as the transfer wheel 32. Auxiliary teeth for rotation of the transfer wheel 32 may be provided. A guide portion 31a for guiding a tape 10 is installed at the upper portion of the frame 31 where the transfer wheel 32 is installed. The transfer wheel 32 rotates in one direction by the action of a third link. Whenever the transfer wheel 32 rotates, the tape 10 advances and the cover tape 13 is detached to expose electronic components so that the electronic components can be picked up. Clockwise rotation of the transfer wheel 32 is prevented by a latch pole 43, and only counterclockwise rotation of the transfer wheel 32 is allowed. Since the structure and operation related to the transfer wheel 32 are well-known and are not the objective of the present invention, detailed descriptions thereof will be omitted.

The driving apparatus 40 rotates the transfer wheel 32 and the sun gear 80 at a predetermined angle. The driving apparatus 40 includes a first link 41 having one end portion fixed to the frame 31 and an eccentric cam portion 41a, a second link 42 of which the central portion is hinge-fixed to the frame 31 and having a cam follower 42a contacting the eccentric cam portion 41a installed at one end portion thereof, and the first latch pole 43 installed at the other end portion of the second link 42 to be capable of pivoting and of which an end portion is elastically biased toward the teeth of the transfer wheel 32 or the auxiliary teeth (not shown). A free end of the first link 41 pivots by an additional actuator 41b. A pneumatic cylinder or a motor having an eccentric cam may be used as the actuator 41b.

One end portion of a third link 44 for transferring a rotational force of the second link 42 is fixed to a position separated by a predetermined distance from a hinge shaft (not shown) of the second link 42. The other end portion of the third link 44 is connected by a fourth link 45 to one end portion of a fifth link 46 having a V shape and installed at the frame 31 to be capable of pivoting. The other end portion of the fifth link 46 is connected to an end portion of a spring 45a fixed to the frame 31 and provides a restoring force during rotation of the fifth link 46. A torsion spring 44a for providing a restoring force of the third link 44 is installed at the other end portion of the third link 44.

A power transfer mechanism for rotating the sun gear 80 at a predetermined angle is provided at the other end portion of the fifth link 46. As can be seen from FIG. 5 and FIG. 6 which will be described later, the power transfer mechanism includes the sixth link 52 having one end portion connected to the other end portion of the fifth link 46 to be capable of pivoting, an auxiliary link 55 having one end portion connected to the other end portion of the sixth link 52 through a link plate 55a to be capable of pivoting, and a planet gear 56 installed at the other end portion of the auxiliary link 55 to be capable of rotating in one direction. In the example shown in the drawing, counterclockwise rotation of the planet gear 56 is possible while clockwise rotation thereof is restricted. Meanwhile, although the sun gear 80 engaged with the planet gear 56 is installed to be capable of rotating in both directions, the sun gear 80 rotates in one direction only because it is engaged with the planet gear 56 and the pinch gear 83. As described above, the roller 88 is installed at one side of the sixth link 52 to compensate for the difference in length according to the running of the cover tape 13.

The pinch gear 83 is rotatably installed at one end portion of a pivot arm 82 installed at the frame 31 to be capable of pivoting. A torsion spring 84 provides an elastic force to bias the pivot arm 82 toward the sun gear 80. As a result, the pinch gear 83 installed at one end portion of the pivot arm 82 is pressed against an inner gear portion 85 of the sun gear 80 and engaged therewith. The pinch gear 83 is installed to be capable of rotating in one direction only. For example, the pinch gear 83 is rotated counterclockwise by a reverse rotation preventing means (not shown) while clockwise rotation of the pinch gear 83 is prevented.

In the rotational operation of the sun gear 80, when the actuator 41b pushes upward one end portion of the first link 41 connected to the actuator 41b, the first link 41 rotates clockwise and accordingly the first through fifth links 41, 42, 44, 45, and 46 perform predetermined rotational actions in order. Consequently, the fifth link 46 rotates counterclockwise overcoming an elastic force of the spring 45a in the drawing so that the sixth link 52 is pulled from the right side to the left side on the plane of the drawing. Here, the planet gear 56 rotates and revolves along an outer gear portion 86 of the sun gear 80. That is, while the sun gear 80 remains unmoved, the planet gear 56 rotate counterclockwise and simultaneously moves counterclockwise along the outer gear portion 86. Since the sun gear 80 engaged with the pinch gear 83 is prevented from rotating in a counterclockwise direction, the sun gear 80 is not affected by the rotation and revolution of the planet gear 56 at all in the counterclockwise direction. Here, the transfer wheel 32 capable of rotating in one direction only does not rotate.

When the actuator 41b moves in the reverse direction, the fifth link 46 pivots clockwise by an elastic force of the spring 45a. Accordingly, the sixth link 52 is moved from the left side to the right side on the plane of the drawing. Here, the planet gear 56 having a structure in which clockwise rotation is restricted consequently pushes the sun gear 80 in a clockwise direction. That is, while the sixth link 52 moves from the left side to the right side on the plane of the drawing, the planet gear 56 does not rotate and transfers an external force to the sun gear 80 engaged with the planet gear 56, so that the sun gear 80 only rotates clockwise. Here, the transfer wheel 32 rotates counterclockwise to run the tape 10.

Next, the pulling operation of the cover tape 13 by the pinch gear 83 and the length difference compensation operation will be described. Since the pinch gear 83 and the inner gear portion 85 of the sun gear 80 are engaged with each other, the sun gear 80 is allowed to rotate only in a clockwise direction and the pinch gear 83 is allowed to rotate only in a counterclockwise direction. Thus, when the sun gear 80 begins to rotate, the cover tape 13 gripped between the sun gear 80 and the pinch gear 83 runs a distance corresponding to the rotation angle of the sun gear 80. That is, since the pinch gear 83 and the inner gear portion 85 of the sun gear 80 rotate by engaging with each other, the cover tape 13 is pulled accordingly.

The length of the cover tape 13 peeled by the rotation of the transfer wheel 32 is longer by far than a running distance of the cover tape 13 pulled by being gripped between the pinch gear 83 and the inner gear portion 85 of the sun gear 80. To compensate for the above difference, the cover tape 13 slips a predetermined distance in the reverse direction at each period. In detail, although the cover tape 13 is gripped between the pinch gear 83 and the inner gear portion 85 of the sun gear 80, since the cover tape 13 is very thin, when the cover tape 13 is pulled by an external force in the state in which the gears are stopped, the cover tape 13 can be moved by slipping between the gears. Since both the pinch gear 83 and the sun gear 80 are prevented from rotating in one direction, when the cover tape 13 is pulled in the state in which the gears are stopped, the cover tape 13 can escape between the engaged gears.

The cover tape 13 passes through a guide 91 on the frame 31 which is partially shown on the drawing and runs along a roller 93 on the frame 31 and the roller 88 on the sixth link 52. When the sixth link 52 is pulled from the right side to the left side, the rotation of the transfer wheel 32 is prevented by the rotation of the latch pole 43. Thus, one end of the tape 10 remains to be fixed by the transfer wheel 32. However, since the movement of the sixth link 52 changes the position of the roller 88, the cover tape 13 is pulled in the reverse direction of a releasing direction indicated by reference numeral 13a. Here, since the pinch gear 83 and the sun gear 80 are in an unmoved state, the cover tape 13 slips therebetween and runs a predetermined distance in the reverse direction. As a result, the cover tape 13 repeats running in the releasing direction and the reverse direction thereto, so that the difference in length is compensated by the repeated running.

Figure 6:
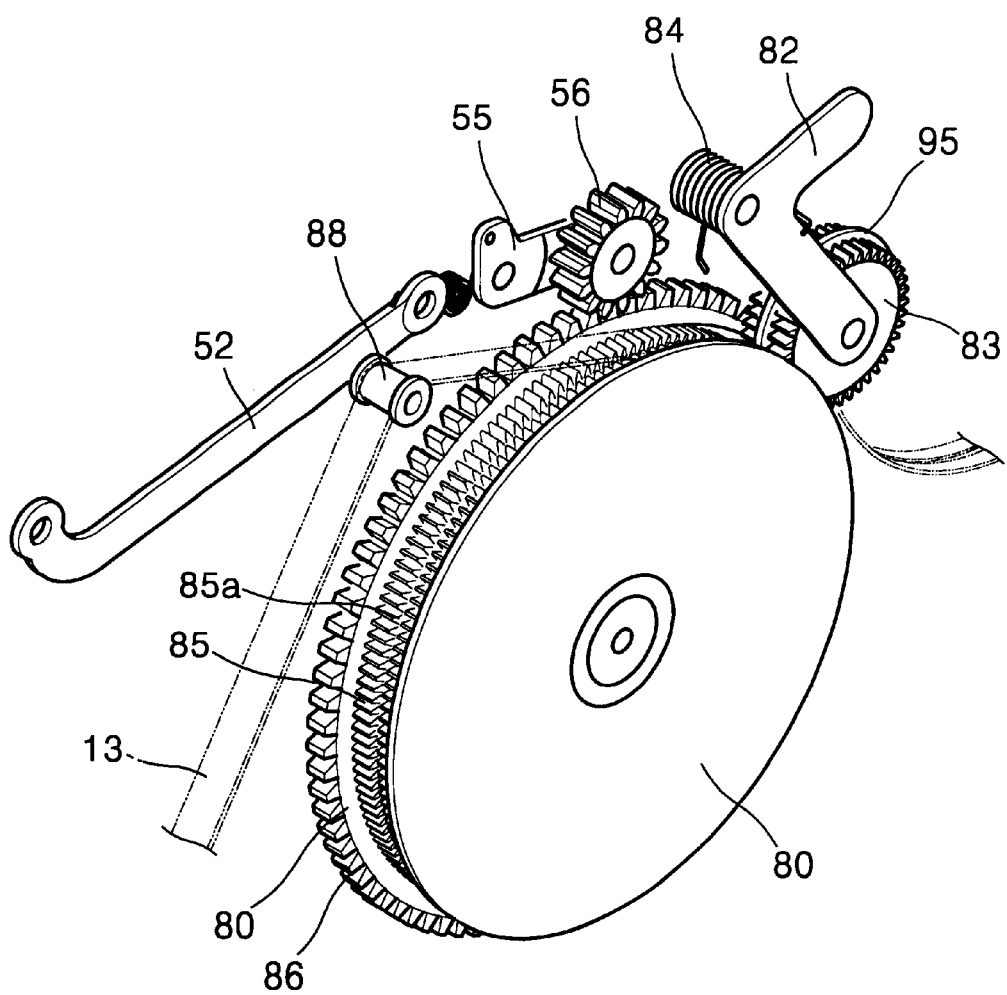
FIG. 6 is a perspective view of the cover tape forming apparatus of FIG. 5.

FIG. 6 shows part of the cover tape forming apparatus shown in FIG. 5. Referring to the drawing, it can be seen that the planet gear 56 is engaged with the outer gear portion 86 of the sun gear 80 and that the pinch gear 83 is engaged with the inner gear portion 85 of the sun gear 80. According to a characteristic feature of the present invention, a groove 85a is formed along the circumferential surface of the inner gear portion 85 of the sun gear 80 and a protruding portion 95 corresponding to the groove 85a is formed along the outer circumferential surface of the pinch gear 83. While passing between the inner gear portion 85 of the sun gear 80 and the pinch gear 83, the cover tape 13 is formed to have a shape corresponding to the groove 85a and the protruding portion 95.

Forming the cover tape 13 as above has an important meaning in discharging the cover tape. That is, when the section of the cover tape 13 is changed to a shape having a predetermined bent portion from a flat shape having a thickness only, the cover tape 13 becomes stiff even if it is formed of a flexible material. Thus, it is possible to discharge the cover tape 13 in a desired direction without an additional means. Also, the cover tape 13 is not blown or tangled with other parts by any external force such as air flow in a work place.

Figure 7A:
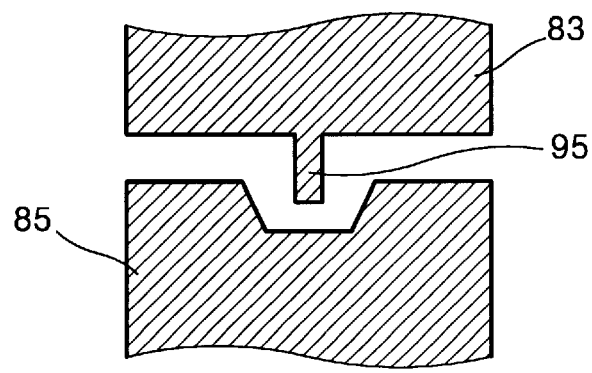
FIGS. 7A through 7E are sectional views of the gears and protrusions for tape forming.
Figure 7B:
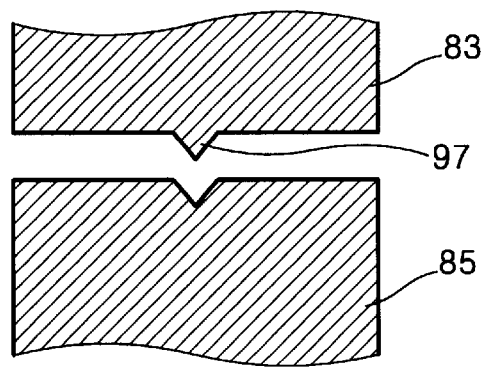
Figure 7C:
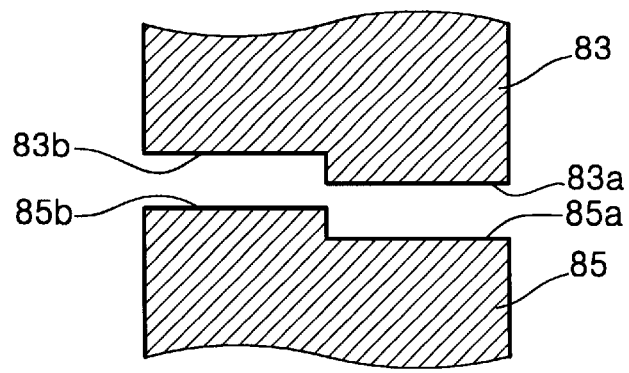
Figure 7D:
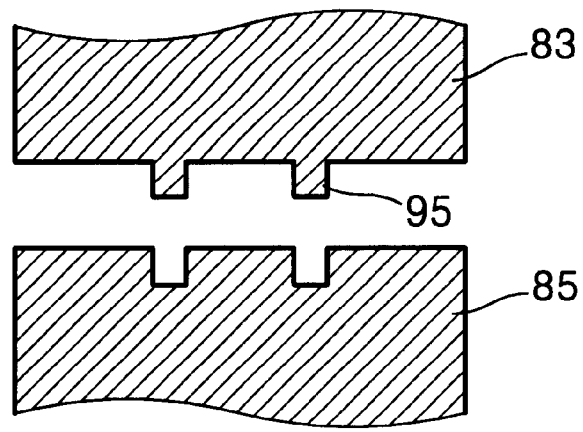
Figure 7E:
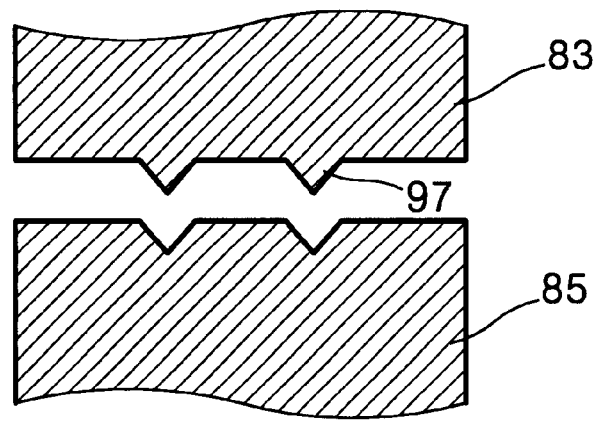

FIGS. 7A through 7E are sectional views showing various shapes of the inner gear portion 85 of the sun gear 80 and the pinch gear 83. Referring to FIG. 7A, a protrusion 95 having a rectangular section is formed on the pinch gear 83 and a groove corresponding to the protrusion 95 is formed in the inner gear portion 85. In FIG. 7B, a protrusion 97 having a triangular section is formed on the pinch gear 83 and a groove corresponding to the protrusion 95 is formed in the inner gear portion 85. In FIG. 7C, the surfaces of the gears are formed to be stepped and a gear is formed on the surfaces facing each other of one of two stepped portions or on the surfaces facing each other of both stepped portions. For example, a gear is formed only on each of surfaces 83a and 85a and the other stepped portion is formed to be flat. Also, gears may be formed on all surfaces 83a, 83b, 85a and 85b. FIGS. 7D and 7E show a plurality of protrusions 95 and 97 each having a rectangular section or a triangular section, respectively.

Figure 8:
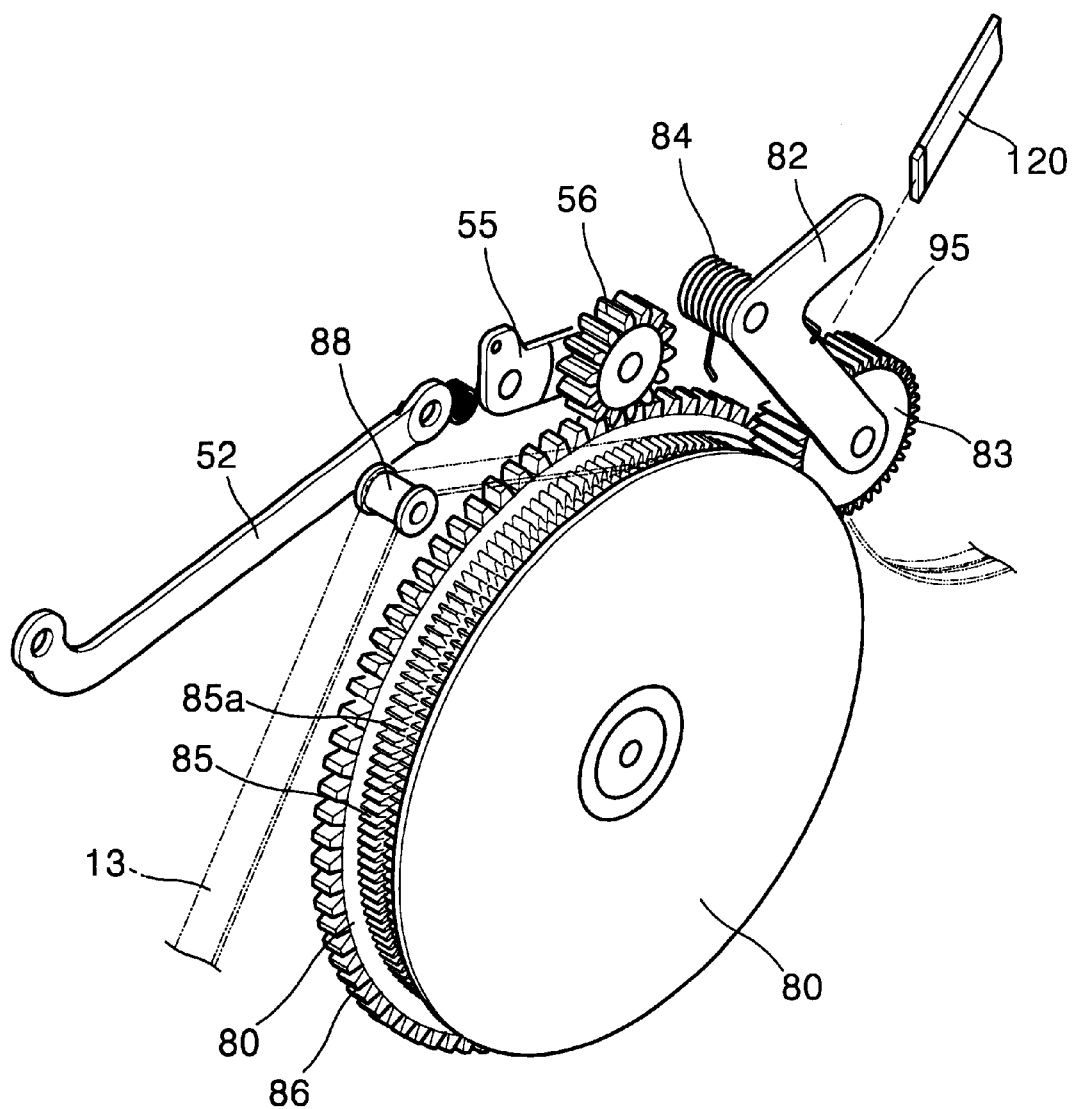
FIG. 8 is a perspective view of a cover tape forming apparatus according to yet another embodiment consistent with the present invention.

FIG. 8 shows a cover tape forming apparatus according to another preferred embodiment of the present invention. In the drawing, the same reference numerals as in FIG. 6 indicate the same elements having the same functions and description thereof will be omitted.

Figure 1:
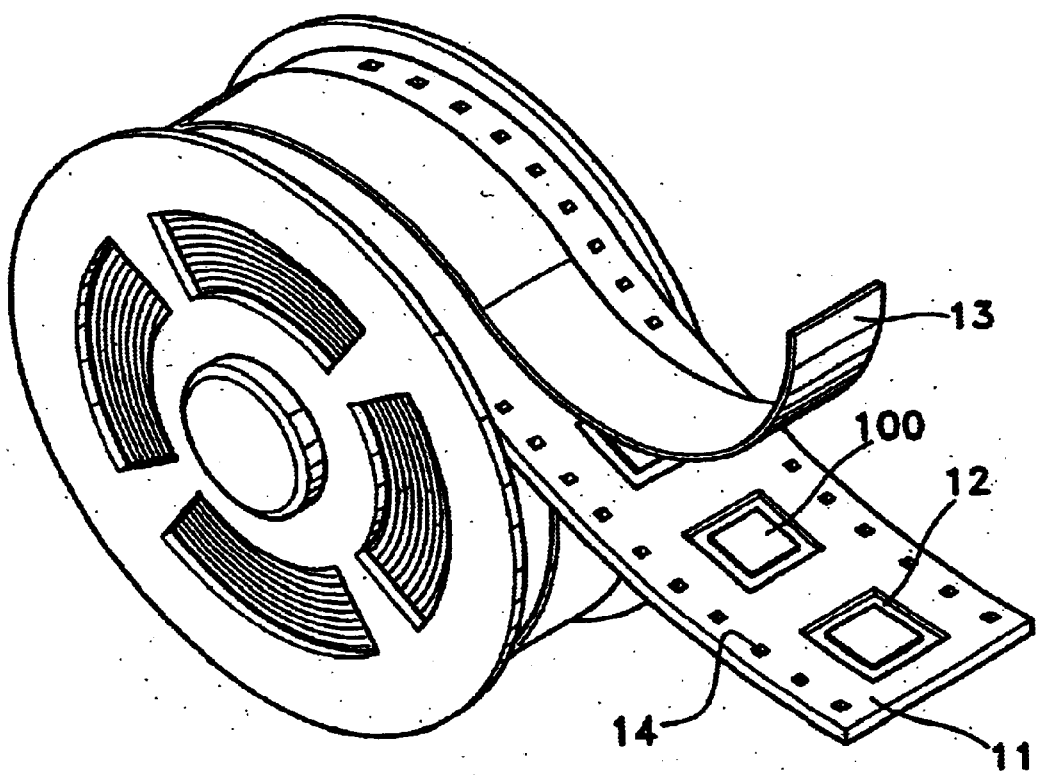
FIG. 1 is a perspective view of the tape used in a tape feeder having electronic components attached thereon.
Figure 2:
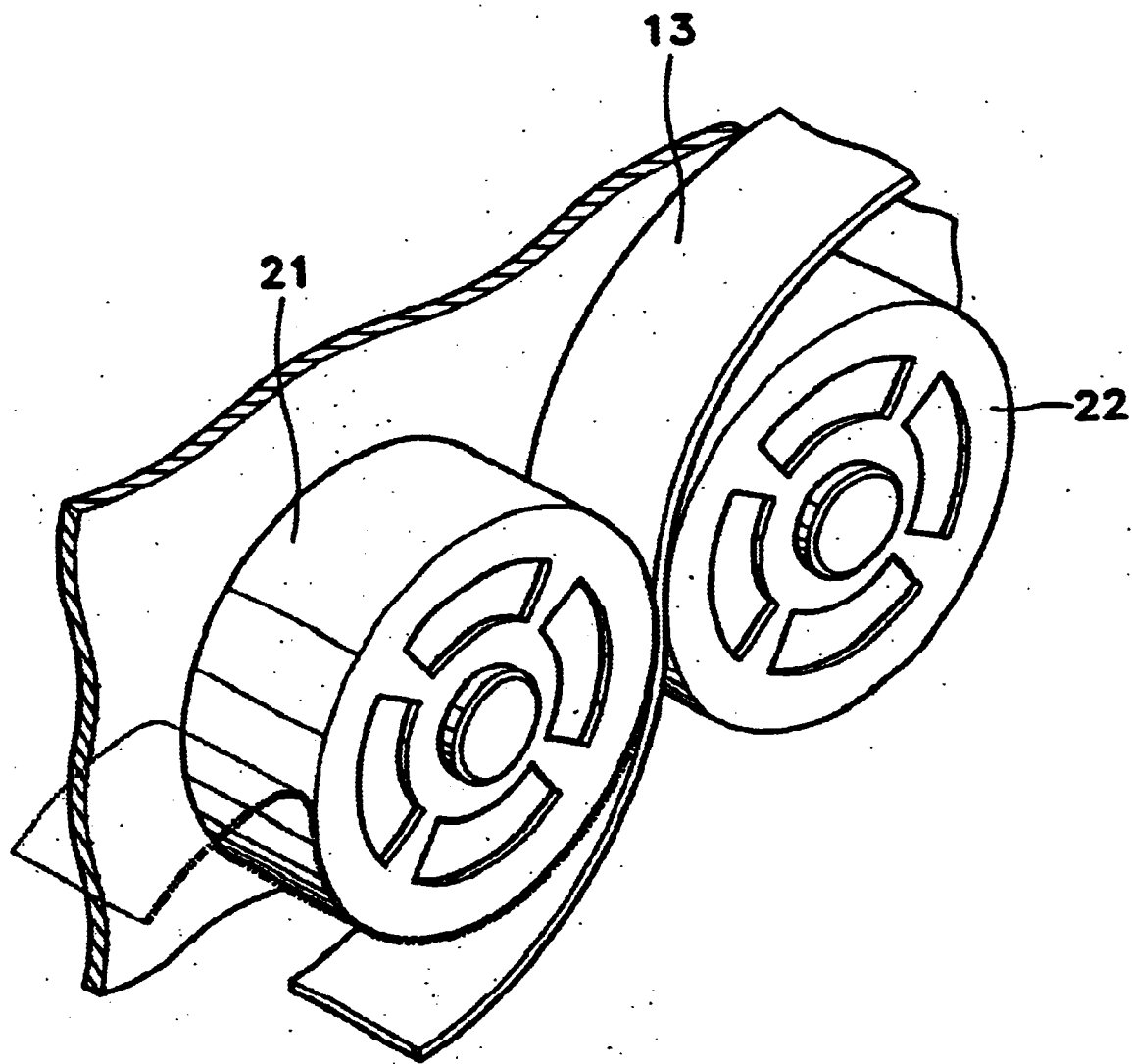
FIG. 2 is a perspective view showing part of the conventional cover tape discharging apparatus.

Referring to the drawing, to perform the forming to the cover tape 13, the groove 85a is formed on the inner gear portion 85 of the sun gear 80 and a protrusion 120 corresponding to the groove 85a is additionally formed and fixed to the frame 31 (see FIG. 2). Unlike the above-described preferred embodiment of FIG. 5, a protrusion is not formed on the pinch gear 83. The shape of the section of each of the protrusion 120 and the groove 85a may be any of the shapes shown in FIGS. 7A through 7E.

Although not shown in the drawing, a means for applying heat to the cover tape during the forming may be provided. For example, a heat wire can be included in the pinch gear 83 or the pivot arm 82 having the pinch gear 83 at one end portion thereof. By supplying electricity through the heat wire, heat is applied to the cover tape 13 via the pinch gear 83 while performing forming to the cover tape 13. As a result, the cover tape 13 becomes tense so that it can be easily discharged. Also, the heat wire may be installed at the inner gear portion 85 of the sun gear 80.

As described above, the cover tape formed in the tape feeder according to the present invention becomes more stiffened so that it can be easily discharged. Also, by providing the length difference compensating mechanism, a constant tension can always be provided to the cover tape.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An apparatus for forming a cover tape of a tape feeder, comprising:
    a tape detachment device configured to detach the cover tape from the base tape;
    a first rotary body comprising at least one protruding portion along an outer circumferential surface thereof; and
    a second rotary body comprising at least one groove along an outer circumferential surface thereof for accommodating the at least one protruding portion,
    wherein the first rotary body and the second rotary body are configured to receive and pass the detached cover tape therebetween, thereby forming the cover tape.

2. The apparatus as claimed in claim 1, wherein an elastic body is provided to bias a rotation shaft of at least one of the first or second rotary body in one direction so that one of the first and second rotary bodies is pressed against the other rotary body.

3. The apparatus as claimed in claim 1, wherein a heat wire for heating the cover tape is included in at least one of the first and second rotary bodies.

4. The apparatus as claimed in claim 1, wherein the second rotary body is rotated by being engaging with the first rotary body.

5. The apparatus as claimed in claim 1, comprising a ratchet wheel installed at one of the first and second rotary bodies and coaxially aligned with a rotation shaft of the rotary body to prevent reverse rotation of one of the first and second rotary bodies.

6. The apparatus as claimed in claim 1, wherein the tape detachment device comprises a wheel having at least one tooth formed at the outer circumferential surface, wherein rotation of the wheel detaches the cover tape from the base tape.

7. An apparatus for forming a cover tape of a tape feeder, comprising:
   a sun gear rotatably installed at a frame and having a gear portion, the gear portion comprising at least one groove having a predetermined shape;
   a power transfer means for transferring an external force to rotate the sun gear;
   a pinch gear gripping the cover tape with the gear portion of the sun gear and rotating in one direction by engaging with the sun gear; and
   at least one protruding portion for forming the cover tape, engaged with the at least one groove of the gear portion of the sun gear so that the cover tape can be formed to have a predetermined shape.

8. The apparatus as claimed in claim 7, wherein the at least one protruding portion is formed at an outer circumference surface of the pinch gear.

9. The apparatus as claimed in claim 7, wherein the at least one protruding portion is fixed to the frame to correspond to the at least one groove.

10. The apparatus as claimed in claim 7, wherein the pinch gear is stepped to provide the protruding portion.

11. The apparatus as claimed in claim 7, wherein a heat wire is installed at the pinch gear or the sun gear to apply heat to the cover tape during the forming.

12. A tape feeder comprising:
    a frame;
    a transfer wheel rotatably installed at one side of the frame and transferring a tape where components are accommodated at a predetermined pitch;
    a sun gear rotatably installed at the other side of the frame and having a first gear portion including at least one groove having a predetermined shape;
    a power transfer mechanism for transferring an external force to rotate the sun gear;
    a pinch gear gripping a cover tape with the first gear portion of the sun gear and being capable of rotating in only one direction by being engaged with the sun gear; and
    at least one protruding portion engaged with the at least one groove of the first gear portion of the sun gear so that the cover tape can be formed to have a predetermined shape.

13. The tape feeder as claimed in claim 12, wherein: the power transfer mechanism comprises:
    a planet gear revolving and rotating by being engaged with second gear portion formed on the sun gear; and
    a link having the planet gear rotatably installed at one end portion thereof; and
    the tape feeder comprising:
    a first roller installed at one side of the link; and
    a second roller installed at one side of the frame;
    wherein the cover tape slips between the pinch gear and the first gear portion of the sun gear to run in the reverse direction of a releasing direction when the link is moved in a state where a part of the cover tape is fixed by the transfer wheel.

14. An apparatus for forming a cover tape of a tape feeder, comprising:
    a first rotary body comprising:
      a first gear portion; and
      at least one protruding portion along an outer circumferential surface of the first rotary body; and
    a second rotary body comprising:
      a second gear portion configured to engage with the first gear portion; and
      at least one groove portion along an outer circumferential surface of the second rotary body for accommodating the at least one protruding portion,
    wherein the cover tape is formed by passing between the first rotary body and the second rotary body.

15. The apparatus as claimed in claim 14, comprising an elastic body to bias a rotation shaft of at least one of the first or second rotary body in one direction so that one of the first and second rotary bodies is pressed against the other rotary body.

16. The apparatus as claimed in claim 14, comprising a heat wire for heating the cover tape in at least one of the first and second rotary bodies.

17. The apparatus as claimed in claim 14, wherein the second rotary body is rotatable by engagement with the first rotary body.

18. The apparatus as claimed in claim 14, comprising a ratchet wheel installed at one of the first and second rotary bodies and coaxially aligned with a rotation shaft of the rotary body to prevent reverse rotation of one of the first and second rotary bodies.

19. The apparatus as claimed in claim 14, further comprising a power transfer member for transferring an external force to rotate at least one of the first and second rotary bodies.

* * * * *